United States Patent
Loopik et al.

(10) Patent No.: US 12,416,678 B2
(45) Date of Patent: Sep. 16, 2025

(54) DISTRIBUTED BATTERY MONITORING SYSTEM

(71) Applicant: Analog Devices International Unlimited Company, Limerick (IE)

(72) Inventors: Leon Alexander Loopik, Delft (NL); Pradeep Kotte-Prakasam, Frisco, TX (US); Caspar Petrus Laurentius Van Vroonhoven, Munich (DE); Christoph Sebastian Schwoerer, Grasbrunn (DE); James Michael Douglass, Lewisville, TX (US)

(73) Assignee: Analog Devices International Unlimited Company, Limerick (IE)

( * ) Notice: Subject to any disclaimer, the term of this patent is extended or adjusted under 35 U.S.C. 154(b) by 132 days.

(21) Appl. No.: 17/871,623

(22) Filed: Jul. 22, 2022

(65) Prior Publication Data
US 2024/0027533 A1    Jan. 25, 2024

(51) Int. Cl.
*G01R 31/389* (2019.01)
*G01R 31/385* (2019.01)

(52) U.S. Cl.
CPC ......... *G01R 31/389* (2019.01); *G01R 31/385* (2019.01)

(58) Field of Classification Search
CPC ............... G01R 35/007; G01R 31/396; G01R 31/389; G01R 31/3648; G01R 27/02; Y02E 60/10
(Continued)

(56) References Cited

U.S. PATENT DOCUMENTS

| | | |
|---|---|---|
| 8,648,602 B2 | 2/2014 | Van Lammeren |
| 8,680,868 B2 | 3/2014 | Van Lammeren et al. |

(Continued)

FOREIGN PATENT DOCUMENTS

| | | |
|---|---|---|
| CN | 117434461 A | 1/2024 |
| DE | 102023118589 A1 | 1/2024 |
| WO | 2019163301 | 8/2019 |

OTHER PUBLICATIONS

"Panasonic Develops Battery Management Technology to Measure Electrochemical Impedance of multi-cell stacked Lithium-Ion Batteries.", [Online] Retrieved from the Internet: <URL: https://news.panasonic.com/global/press/data/2019/11/en191114-2/en191114-2.html>, (Nov. 14, 2019), 5 pgs.
(Continued)

*Primary Examiner* — Raul J Rios Russo
*Assistant Examiner* — Trung Q Nguyen
(74) *Attorney, Agent, or Firm* — Schwegman Lundberg & Woessner, P.A.

(57) ABSTRACT

A system for measuring a complex impedance associated with an arrangement of battery or fuel cells in an energy storage system may include a controller, a current measurement device, and voltage measurement devices. The current measurement device may be shared by the cells for measuring a test current provided to the cells. The voltage measurement devices may be respectively coupled across corresponding cells. The controller, the current measurement device, and the voltage measurement devices may be coupled together using a DC isolated bus. The controller may determine a respective complex impedance of corresponding groups of the cells using a complex voltage measured by a respective voltage measurement device coupled across a corresponding group of the cells and a complex current measured by the complex current measurement device. The controller may be configured to compen-
(Continued)

sate for an asynchrony between particular ones of the current measurement device and the voltage measurement devices via the DC isolated bus.

20 Claims, 6 Drawing Sheets

(58) Field of Classification Search
USPC .................................................. 324/425–434
See application file for complete search history.

(56) References Cited

U.S. PATENT DOCUMENTS

| | | | |
|---|---|---|---|
| 9,035,619 | B2 | 5/2015 | Van Lammeren et al. |
| 9,618,555 | B2* | 4/2017 | Verhulst ................. G01R 27/02 |
| 11,258,113 | B2 | 2/2022 | Yamamoto et al. |
| 2011/0050283 | A1* | 3/2011 | Makinwa ................ H03L 7/091 |
| | | | 327/7 |
| 2012/0139611 | A1* | 6/2012 | Schwoerer ......... G01R 31/3832 |
| | | | 327/339 |
| 2014/0028321 | A1* | 1/2014 | Bourgeois .......... G01R 31/3835 |
| | | | 324/426 |
| 2014/0032147 | A1* | 1/2014 | Verhulst ................ G01R 27/16 |
| | | | 702/65 |
| 2015/0372487 | A1* | 12/2015 | Abe .......................... H02J 1/00 |
| | | | 307/31 |
| 2016/0261127 | A1* | 9/2016 | Worry .................... H02J 7/0029 |
| 2017/0219660 | A1* | 8/2017 | Christensen ............ B60L 58/16 |
| 2019/0221893 | A1* | 7/2019 | Marsili ............... H01M 10/482 |
| 2023/0184842 | A1* | 6/2023 | Lin ....................... H01M 10/00 |
| | | | 702/63 |

OTHER PUBLICATIONS

Gong, Z., et al., "IC for Online EIS in Automotive Batteries and Hybrid Architecture for High-Current Perturbation in Low-Impedance Cells", 2018 IEEE Applied Power Electronics Conference and Exposition (APEC), (2018), 1922-1929.

Howey, David A, et al., "Online Measurement of Battery Impedance Using Motor Controller Excitation", IEEE Transactions on Vehicular Technology, 63(6), (Jul. 2014), 2557-2566.

* cited by examiner

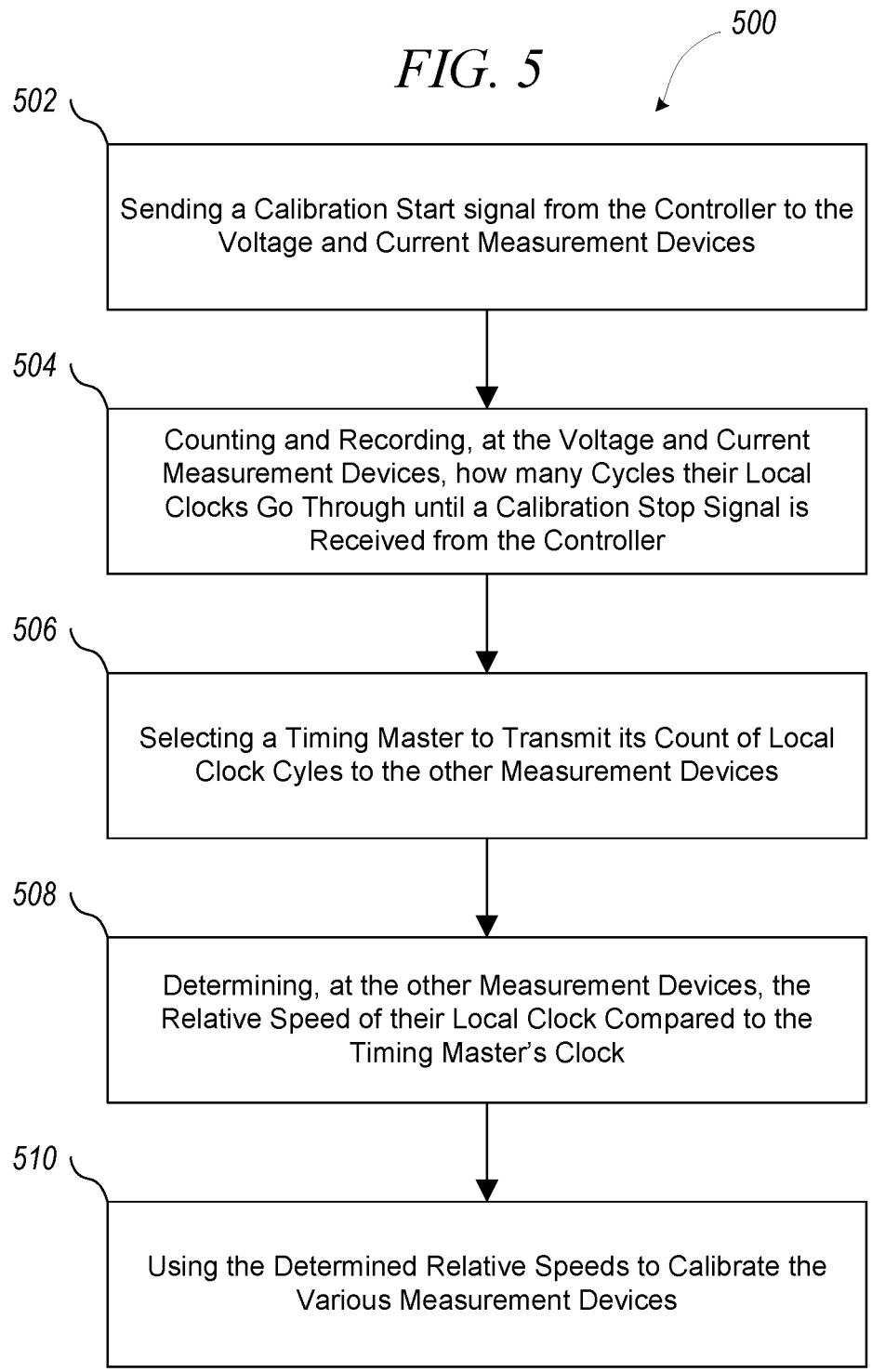

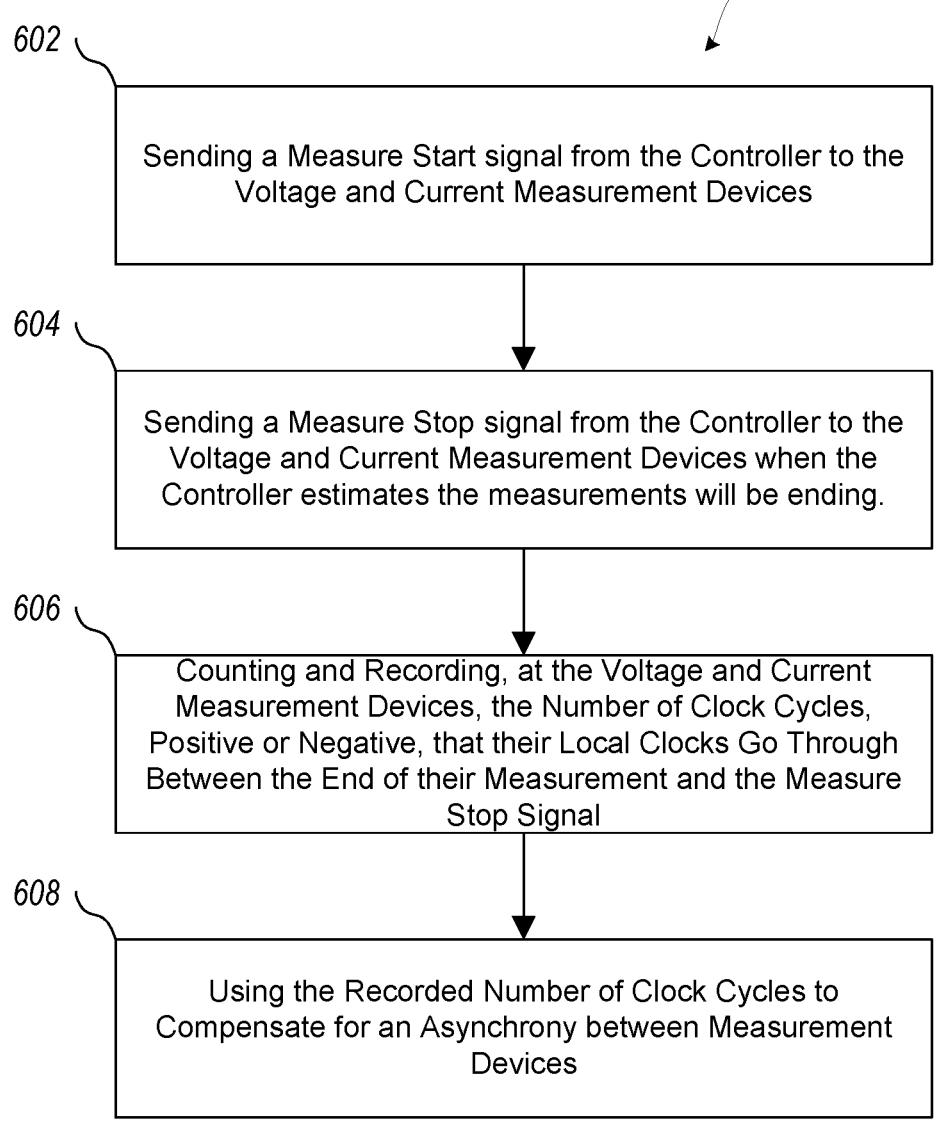

DISTRIBUTED BATTERY MONITORING SYSTEM

TECHNOLOGICAL FIELD

The present disclosure relates to electronics, and more particularly, but not by way of limitation, to a battery monitoring system that can determine the complex impedance of battery cells or other electrochemical energy storage systems.

BACKGROUND

Modern systems can use electrochemical energy storage systems, such as batteries or fuel cells, as a main power source or an auxiliary power source. Examples of such modern systems can include consumer electronics, industrial electronics, passenger cars, and industrial trucks. Monitoring the state of charge (SoC) and the state of health (SoH) of a battery can help ensure reliable operation of the system and avoid unnecessary damage to the battery, such as due to overheating or over-discharging.

SUMMARY

One approach to estimate the SoC and SoH is electrochemical impedance spectroscopy (EIS). EIS can be used to determine the complex impedance of a cell or group of cells in an energy storage system. The energy storage system may include an arrangement of battery of fuel cells. The complex impedance of a cell or group of cells can be determined at a single frequency or at multiple frequencies. The determined complex impedance of the cell or group of cells can be used to obtain information about the SoC and SoH of the cell or group of cells. The determined complex impedance can be used to estimate the charge level of the cell or group of cells. The determined complex impedance can be used to estimate the internal temperature of the battery. Estimation of the internal temperature of the battery can be more useful than measuring the external temperature of the battery, which may not accurately reflect internal temperature, resulting in overheating of the battery. The determined complex impedance can be used to estimate the available capacity of the cell or group of cells relative to new. A complex impedance at a single frequency may be useful for determining one or more measures of SoC or SoH. A complex impedance at multiple frequencies may be useful for determining one or more measures of SoC or SoH.

The present inventors have recognized, among other things, that the need for accurate and predictive battery monitoring systems (BMS) has grown with the interest in increasing use-time, range, and performance of the systems and devices using energy storage systems. For example, the more that a battery is discharged (e.g., to a lower SoC) or the more aggressively a battery is used, the more likely the battery is to be damaged if not effectively monitored. The present inventors have recognized that an approach for measuring the direct current (DC) voltage or DC current through one or more cells of the energy storage system may represent the steady-state or average properties of a battery under certain conditions, or the DC voltage and current may represent an instantaneous measurement that includes varying or periodic portions. However, such an approach for measuring DC voltage and DC current may involve multiple integrated circuits (IC) without a shared clock signal or a high bandwidth bus. The ICs may not share a clock signal due to the expense of a clock bus spanning multiple voltage levels. Additionally, some approaches to BMS systems may include economically designed circuits without precision oscillators and may be connected by a bus that may be used for one or more other purposes. The present inventors have recognized, among other things, that determining a complex impedance value may require phase and timing information, and it may be difficult to obtain this information without a shared clock signal or precision oscillators. This document describes, among other things, a battery monitoring system that can be implemented on more than one integrated circuit, such as by sending messages over a bus.

In an example, a system for measuring a complex impedance associated with an arrangement of battery or fuel cells in an energy storage system may include a controller, a current measurement device, and voltage measurement devices. The current measurement device may be shared by the cells for measuring a test current provided to the cells. The voltage measurement devices may be respectively coupled across corresponding cells. The controller, the current measurement device, and the voltage measurement devices may be coupled together using a DC isolated bus. The controller may determine a respective complex impedance of corresponding groups of the cells using a complex voltage measured by a respective voltage measurement device coupled across a corresponding group of the cells and a complex current measured by the complex current measurement device. The controller may be configured to compensate for an asynchrony between particular ones of the current measurement device and the voltage measurement devices via the DC isolated bus.

In an example, a system for measuring a complex impedance of one or more battery cells in a battery system may include a complex current measurement device, complex voltage measurement devices, and a controller. The complex voltage measurement devices may be coupled across respective groups of the cells. The controller may be coupled to the complex current measurement device and the complex voltage measurement devices via a DC isolated bus arranged to pass complex current measurement data from the complex current measurement device and complex voltage measurement data from the complex voltage measurement devices to the controller for determining an indication of complex impedance using a complex voltage value and a complex current value.

In an example, a method to compensate for an asynchrony between components in a system for measuring an impedance of battery or fuel cells may include performing an asynchrony compensation between particular ones of a current measurement device and one or more voltage measurement devices associated with one or more cells in the system. The asynchrony compensation may be based on measuring at least one of a time or a number of local clock cycles associated with cell current or voltage measurement by respective particular ones of the current measurement device and the voltage measurement devices relative to at least one of a Measure Start signal or a Measure Finish signal.

BRIEF DESCRIPTION OF THE DRAWINGS

FIG. 5 is a flow chart showing an example of a method for operating portions of a battery monitoring system.

FIG. 6 is a flow chart showing an example of a method for operating portions of a battery monitoring system.

DETAILED DESCRIPTION

The present disclosure relates to a battery monitoring system that can determine the complex impedance associated with a cell or group of cells in an energy storage system.

A complex current or voltage may be associated with a corresponding frequency value, an amplitude value, and a phase value. The frequency value may represent the frequency at which a periodic impedance test signal repeats itself. Frequency may be measured in the number of times the signal repeats itself per second, or Hertz (Hz). The amplitude value may represent the size or magnitude of the current or voltage signal. The amplitude value may be measured in Amps (A) for current and Volts (V) for voltage. The amplitude value may be determined by the peak of the periodic signal, or it may be determined by some other method, such as taking the square root of the mean of the signal squared (RMS). Using an amplitude measured in RMS units may be helpful in determining power dissipation. The phase value may be determined by measuring the position of one signal in time relative to the position of another signal in time. For example, the positive-going zero crossing of a voltage signal may be measured relative to the positive-going zero crossing of a current signal. If the voltage and current signals are aligned in time, the signals may be defined as being in phase, and the phase value may be defined as 0 degrees. If the voltage signal may be peaking when the current signal is at its positive crossing zero, this may be defined as the voltage signal leading the current signal by 90 degrees.

A complex impedance value may have a magnitude and a phase value at a given frequency. A complex impedance value may also be defined in terms of a real component and an imaginary component at a given frequency. A complex impedance value may be determined for a circuit element or a group of circuit elements by dividing a complex voltage value across the circuit element or elements by a complex current value through the circuit element or elements:

$$Z = \frac{V}{I}$$

where Z represents the complex impedance, V represents the complex voltage, and I represents the complex current. The magnitude of the complex impedance value may represent the ratio of the magnitude of the voltage to the magnitude of the current, and the phase of the complex impedance value may represent the difference in between the phase of the complex voltage and the phase of the complex current. Because the phase value of the complex impedance represents the relative difference between the phases of the voltage and current, an absolute measure of phase relative to a specific point in time is not required.

Figure 1:
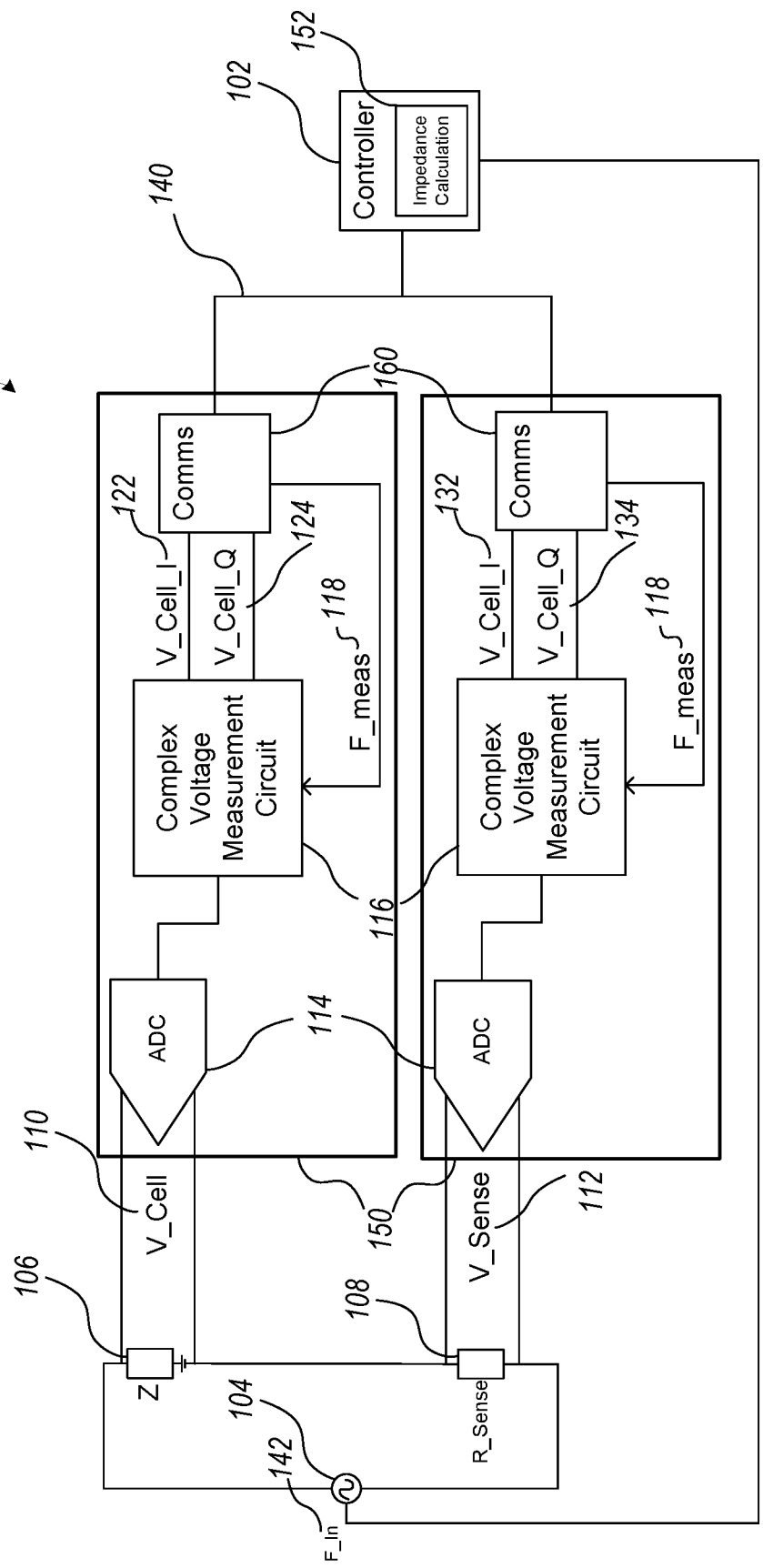
FIG. 1 is a schematic drawing of an example of portions of a battery monitoring system circuit.

FIG. 1 is a schematic diagram of an example of portions of a BMS circuit 100 for testing an energy storage cell 106. In the example of FIG. 1, the BMS circuit 100 can include a BMS controller 102, a test signal generation circuit 104, a test resistor 108, one or more complex voltage processing circuits 150 for processing complex voltages, and a communication bus 140.

The BMS controller 102 may include an integrated circuit (IC), a field-programmable gate array (FPGA), or any other device capable of executing computer code. The BMS controller 102 may include flash memory, random access memory, and any other type of memory storage device. The BMS controller 102 may be a portion of another circuit, or the tasks of the BMS may be handled by performing operations using programmed or stored instructions and a computer or controller. The BMS may perform operations in addition to battery monitoring. The BMS controller 102 may be connected to one or more test signal generation circuits 104 and one or more complex voltage processing circuits 150. The BMS controller 102 may communicate with the one or more test signal generation circuits 104 or the one or more complex voltage processing circuits 150 using one or more communication buses 140 or another type of communication system. The BMS controller 102 may include an impedance calculation circuit 152, for determining the impedance of one or more energy storage cells 106.

The impedance calculation circuit 152 may determine the complex impedance of an energy storage cell 106 by dividing the complex voltage across the energy storage cell 106 by the complex current through the energy storage cell 106—calculating complex conductance (inverse of complex impedance) should be understood in this document to be equivalent to calculating complex impedance and is addressed in this document by using the term complex impedance to refer generally to a complex impedance or its inverse complex conductance. Additionally, the impedance calculation circuit 152 may determine the complex impedance of an energy storage cell 106 by accepting as inputs two complex voltage values, and one corresponding test resistor 108 resistance value R_Sense, across which one of the voltage measurements is made. The test resistor 108 resistance value R_Sense may be measured or calibrated initially or periodically and not taken as an input. In an example, the BMS controller 102 may calculate a value indicative of the complex impedance of the energy storage cell 106, such as the inverse of the impedance. In an example, the BMS controller 102 may calculate of value indicative of the complex impedance of the energy storage cell 106, and compare this calculated indicative value to the value of a similar battery, or the battery currently being measured, such as when the battery was newly manufactured, newly installed, and/or fully charged.

The test signal generation circuit 104 may include a current generator, a voltage generator, or any other circuit capable of producing a varying or periodic test or "excitation" signal. The test signal generation circuit 104 may be connected to the BMS controller 102 via a communication bus or another wired or wireless communication system. The test signal generation circuit 104 may receive a test signal frequency input 142 from the BMS controller 102. The test signal generation circuit 104 may be connected in series with a device under test, such as an energy storage cell 106, or an arrangement of energy storage cells. The test signal generation circuit 104 may be capable of producing a time-varying or periodic current or voltage signal at a specified frequency, such as the test signal frequency input 142. The specified frequency may be specifiable, adjustable, or variable, such as being continuously variable across a certain range, or capable of producing one of a number of discrete frequencies. The test signal generation circuit 104 may be connected to one or more charging circuits, one or more rebalancing circuits, one or more load resistors, or one or more operating loads such as a traction motor or a regenerative braking system to provide the desired power source or power sink to generate the voltage or current signal.

The energy storage cell 106 may be a battery cell a fuel cell, or some other type of energy storage cell. The energy storage cell 106 may have an internal impedance, Z, and a voltage V_Cell 110. The internal impedance may be a complex value with a magnitude and phase component. The internal impedance may vary based upon the frequency at which Z is measured and upon the SoC and SoH of the energy storage cell 106. A complex voltage processing circuit 150 may be connected across the energy storage cell 106

The test resistor 108 may be a dedicated resistive element having a specified, measured, or calibrated resistance. The test resistor 108 may be connected in series with an energy storage system. The test resistor 108 may be connected in series with the test signal generation circuit 104. The test resistor 108 may be used to generate a voltage, V_Sense 112, corresponding to the current through the test resistor 108 and therefore through the energy storage cell or system. Converting the energy storage cell or system current to a voltage may allow the voltage and the respective current to be measured by a voltage measurement circuit. A complex voltage processing circuit 150 may be connected across the test resistor 108.

The one or more complex voltage processing circuits 150 may include a digital sampling circuit 114, a complex voltage measurement circuit 116, a communications circuit 160, and additional digital and/or analog signal processing circuitry. The one or more complex voltage processing circuits 150 may be connected across a circuit element, such as an energy storage cell 106 or a test resistor 108, to measure the voltage across the circuit element. The one or more complex voltage processing circuits 150 may take the voltage across the connected circuit element as an input. The one or more complex voltage processing circuits 150 may also take a measurement frequency 118 as an input. The complex voltage processing circuits 150 may produce as outputs a complex voltage measurement, such as including an amplitude and a phase or a real component and an imaginary component, at a specified frequency.

The complex voltage processing circuit 150 connected across the energy storage cell 106 may produce as outputs a real component of the cell voltage V_Cell_I 122, and an imaginary component of the cell voltage V_Cell_Q 124. The complex voltage processing circuit 150 connected across the test resistor 108 may be similar to the voltage processing circuit 150 connected across the energy storage cell 106, or may differ in one or more aspects. The complex voltage processing circuit 150 connected across the test resistor 108 may produce as outputs a real component of the test resistor voltage V_Sense_I 132, and an imaginary component of the rest resistor voltage V_Sense_Q 134. In an example, the one or more of the complex voltage processing circuits 150 produce outputs corresponding to the amplitude and phase of a voltage value.

The communications circuit 160 may be connected to the controller 102 by the communications bus 140. The communications circuit 160 may process input signals from the controller 102 and distribute various portions of the input signals to the other circuit components. The communications circuit 160 may process output signals from the complex voltage processing circuits 150 that are sent to the controller 102. The communications circuit 160 may convert an analog signal to a digital signal, or a digital signal to an analog signal. The communications circuit 160 may convert a digitized signal of one type or standard to a digitized signal of another type or standard. The communications circuit 160 may perform buffering or storage tasks for the input and output information.

The complex voltage measurement circuit 116 may accept as inputs a digitized representation of a voltage, and a measurement frequency 118, and produce as outputs values indicative of the complex voltage of the incoming digitized voltage representation. The complex voltage measurement circuit 116 may also accept as inputs a timing indication upon which to base the phase measurement. The timing indication may be included in the measurement frequency 118 input. In an example, the complex voltage measurement circuit 116 generates an output corresponding to the relative timing of its phase measurement for use by the impedance calculation circuit 152 in determining the correct phase of the measurement. The frequencies at which complex impedance of one or more of the energy storage cells 106 are measured or calculated may span a large range such as from 0.01 Hz to 100 kHz, 0.1 Hz to 10 kHz, 10 Hz to 8 kHz, or 3 kHz to 6 kHz.

From the measurement frequency 118 and timing indication, the complex voltage measurement circuit 116 may determine the complex impedance by various methods, such as can include projecting the incoming digitized voltage representation upon orthogonal reference signals, such as two periodic signals that are 90 degrees out of phase, such as a "Sine" and a "Cosine" signal. The portion of the incoming digitized voltage representation that is in phase with the "Sine" signal may be referred to as the real component and the portion in phase with the "Cosine" signal may be referred to as the imaginary component. The complex voltage may be represented as the sum of the real component with the imaginary component multiplied by the imaginary number "i":

$$\text{Complex Voltage} = \text{Real Component} + \text{Imaginary Component} * i$$

$$i = \sqrt[2]{-1}$$

The complex voltage may be transformed to a representation in terms of amplitude and phase:

$$\text{Complex Voltage} = \text{Amplitude} \angle \text{Phase}$$

$$\text{Amplitude} = \sqrt[2]{(\text{Real Component})^2 + (\text{Imaginary Component})^2}$$

$$\text{Phase} = ArcTan\left(\frac{\text{Imaginary Component}}{\text{Real Component}}\right)$$

Figure 2:
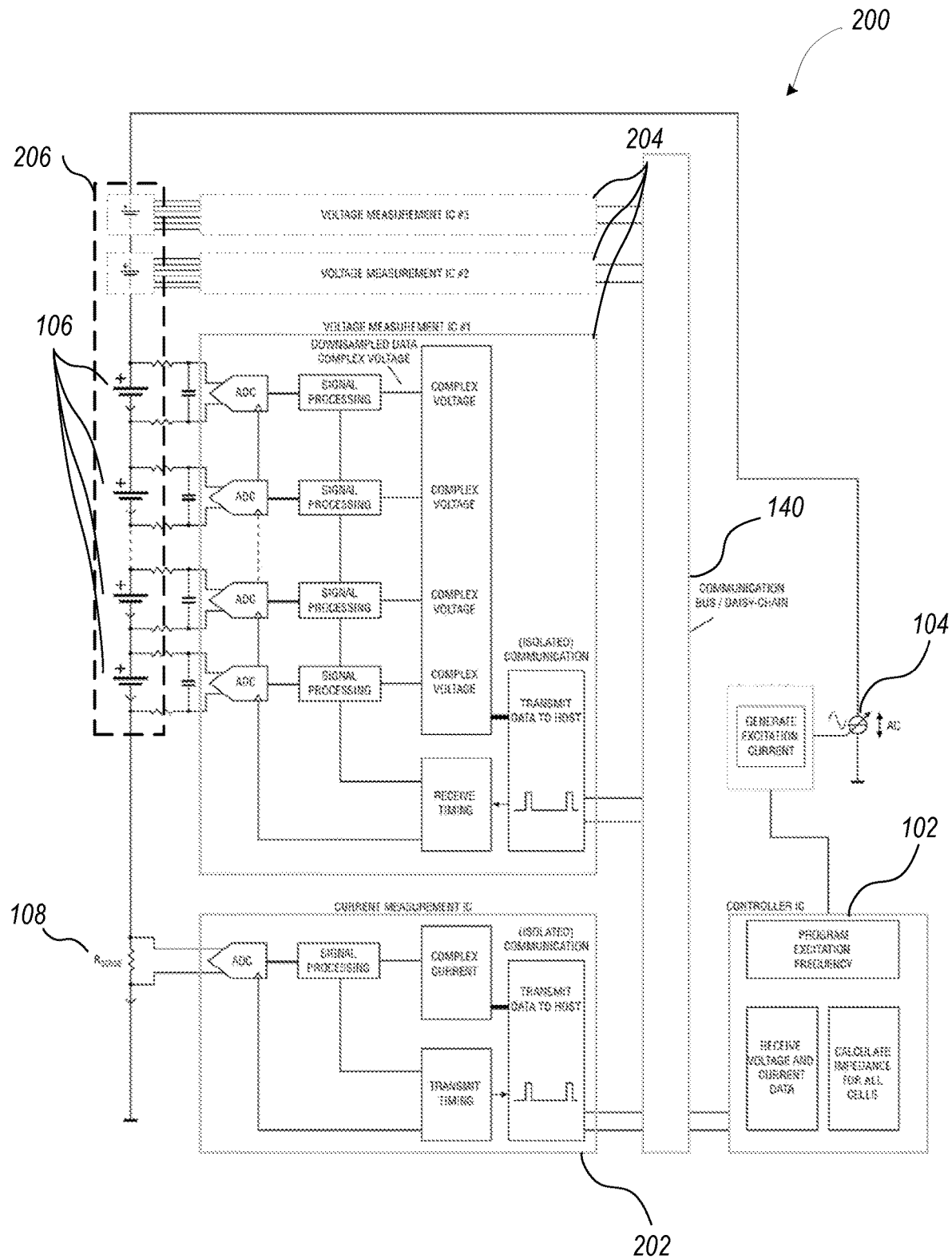
FIG. 2 is a schematic drawing of an example of portions of a battery monitoring system circuit.

FIG. 2 is a schematic diagram of an example of portions of a BMS circuit 200. In the example of FIG. 2, the BMS circuit 200 contains a BMS controller 102, a test signal generation circuit 104, an arrangement of cells comprising an energy storage system 206, a current measurement IC 202 located on an integrated circuit, one or more voltage measurement ICs 204 located on respective integrated circuits, and a communication bus 140. In an example, the BMS circuit 200 is used in an electric or hybrid vehicle, such as in the automotive industry.

The BMS controller 102 receives voltage and current measurements from the various ICs and then calculates the impedance, or a value indicative of impedance, of individual energy storage cells 106 or groups of energy storage cells.

The energy storage system 206 may include one or more energy storage cells 106. The one or more energy storage cells 106 may be similar in design and construction such as chemistry, voltage, and capacity, or they may differ in one or more ways The one or more energy storage cells 106 may be connected in series so that their voltages add together. The one or more energy storage cells 106 may also be connected in parallel so that their capacities add together. In an example, there are a number of groups of 2, 3, 4, or 5 parallel connected cells with the groups connected in series. In an example, there are a number of cells all connected in series. In an example, the number of series-connected cells is between 50 and 300, between 100 and 250, between 150 and 200, or, in an illustrative example, 180.

In an example, each series-connected cell has a voltage value, a current value, and a complex impedance value. In an example, the current value is the same for all of the cells because they are series-connected, and therefore, the current can be measured at one point in the energy storage system 206 to determine the current through all of the one or more energy storage cells 106. This allows the BMS controller 102 to determine the complex impedance of each of the energy storage cells 106 individually by collecting a single complex current value for the battery arrangement from the current measurement IC and a voltage measurement from one of the one or more voltage measurement ICs 204 for each of the energy storage cells 106. This may result in fewer signal messages being transmitted over the communication bus 140 than would be used to calculate complex impedance for each of the cells in other ways. In an example, the voltage one or more voltage measurement ICs 204 and the current measurement IC do not share data about their respective measured value, but instead, send data to the BMS controller 102 which the BMS controller 102 can use to calculate complex cell impedances.

The current measurement IC 202 measures the complex current flowing through the energy storage system 206 or a portion of the energy storage system 206. In an example, the current measurement IC 202 determines the complex current flowing through the measured portion of the energy storage system 206 by measuring the voltage across a test resistor 108, and then using the known value of the test resistor 108 to determine the current. In an example, the current measurement IC 202 passes the measured complex voltage to another circuit which determines the complex current using the known value of the test resistor 108. The current measurement IC 202 is connected to the BMS controller 102 by a bus 140 for communication.

The one or more voltage measurement ICs 204 measure the complex voltage across one or more of the energy storage cells 106. The one or more voltage measurement ICs 204 are connected to the BMS controller 102 by a communication bus 140 for communication. In an example each of the one or more voltage measurement ICs 204 measures the complex voltage of between 5 and 30 cells, between 10 and 20 cells, between 15 and 20 cells, or 18 cells. In an example, the number of cells that each voltage measurement IC 204 measures is limited to keep the maximum differential voltage between any components on the integrated circuit below a desired value, such as 15 volts, 30 volts, 45 volts, 60 volts, 75 volts, 100 volts, or 150 volts. The one or more voltage measurement ICs 204 may measure the voltage of each of the connected cells individually by coupling a voltage measurement circuit across each cell, or the one or more voltage measurement ICs 204 may measure the voltage of one or more arrangements of cells, such as including series and/or parallel arrangements.

The communication bus 140 may transmit digital or analog signals. In an example, the communication bus 140 is a digital serial bus carrying data between various circuits. In an example, the communication bus 140 can be linear topology, a daisy-chained topology, or a hub-and-spoke (star) topology. In an example, the communication bus 140 is a DC isolated bus that uses at least one of capacitive-coupling or inductive-coupling to connect ICs operating at different voltage levels due to their connection to the energy storage system 206 at differing points. A transformer may be used at various points along the communication bus 140 to provide DC isolation and inductive-coupling. A capacitor may be used at various points along the communication bus 140 to provide DC isolation and capacitive coupling. In an example, the communication bus 140 may have a limited bandwidth to conserve resources due to the need for DC isolation or voltage level hopping circuitry between the ICs. In an example, the communication bus 140 may not need or have a universally shared clock signal between all of the connected circuits. In an example, the current measurement IC 202 does share a clock signal with the BMS controller 102, but one or more of the voltage measurement ICs 204 do not share a clock signal with the BMS controller 102. In an example, the circuits have their own local clocks that are asynchronous with one another. The system may avoid distributing a clock signal between all of the ICs because of the difficulty and expense or power consumption of distributing a clock signal between ICs at different DC voltage levels.

The current measurement IC 202 and the one or more voltage measurement ICs 204 may make the complex voltage measurements in a similar fashion to the circuitry of FIG. 1. The current measurement IC 202 and the one or more voltage measurement ICs 204 may receive a signal indicating the desired test frequency of the BMS controller 102 or the actual output frequency of the test current generated by the test signal generation circuit 104. In an example, the current measurement IC 202 determines the test frequency by analyzing it the voltage it measures across the test resistor 108, and sends this determined frequency to the one or more voltage measurement ICs 204. The current measurement IC 202 and the one or more voltage measurement ICs 204 may receive a timing signal to help in determining the phase of the complex voltage measurement. In an example, the receipt time of the signal indicating the frequency may be indicative of the timing signal, such as representing the timing of a positive-going zero crossing of the test current.

In an example where the various integrated circuits do not all share a clock signal, a method is needed to synchronize the circuits so that accurate measurements may be obtained even if the clocks on various circuits run at different speeds. In an example, one or more of the measurement ICs utilize an imprecise oscillator to keep costs lower. It may be helpful to synchronize the speed of the relative clocks so that the various ICs can more accurately estimate the passage of time or more accurately estimate the frequency of the test signal relative to the frequency of their own clock.

Figure 3:
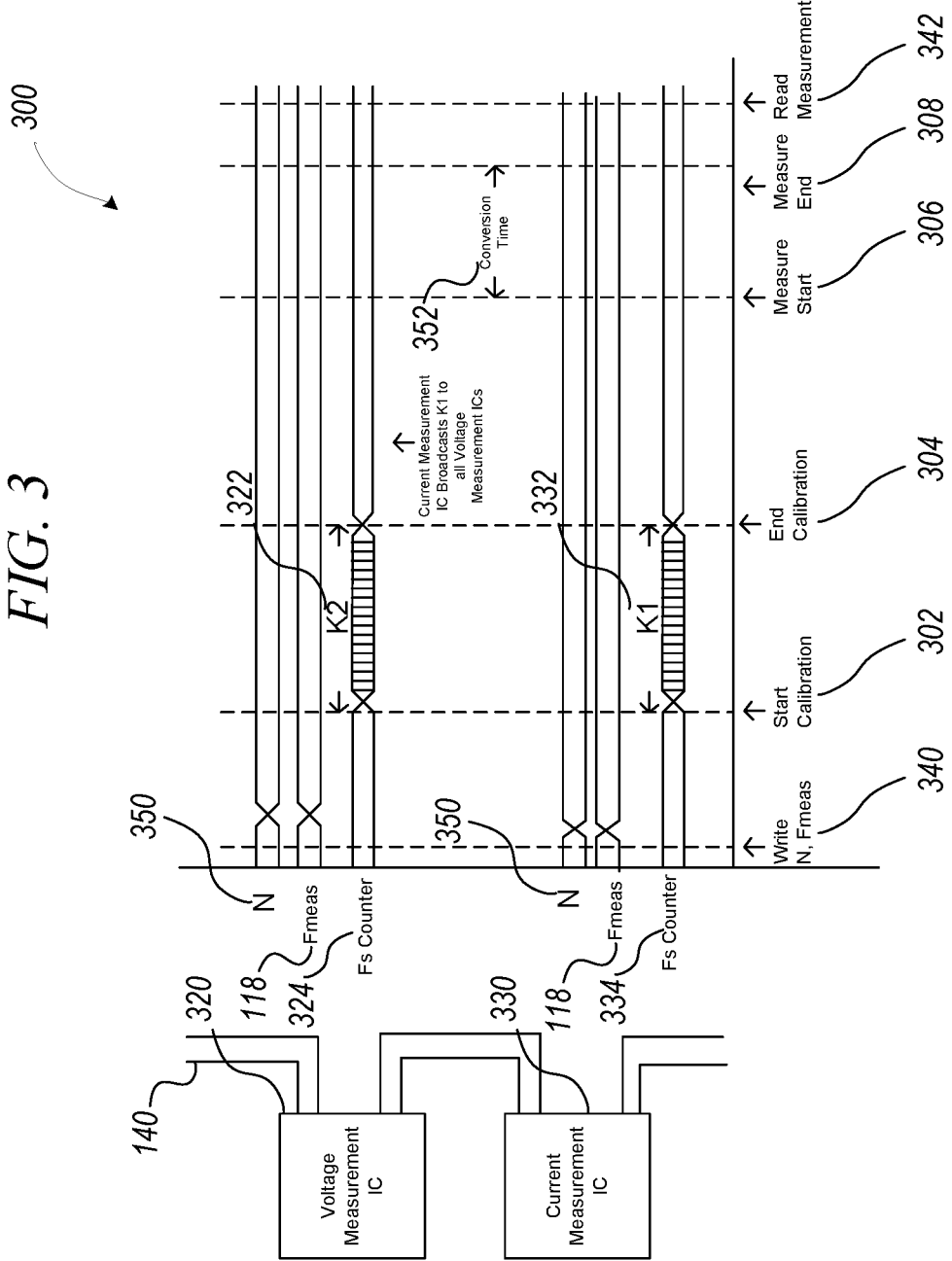
FIG. 3 is a linear graph in time showing an example of operating portions of a battery monitoring system circuit.

FIG. 3 is a linear graph in time showing an example of operating portions of a BMS circuit 300. FIG. 3 shows a current measurement device 330, a voltage measurement device 320, a portion of the signals and messages sent and received by these measurement devices, and a portion of the internal operations of these measurement devices. In the example of FIG. 3, the various measurement devices may perform an initial calibration before beginning their current and/or voltage measurements.

The initial calibration may be performed after one or more of the measurement devices receive a message or signal from the BMS controller 102 indicating the measurement frequency 118 and the measurement length 350 at 340. The one or more measurement devices may store these values locally. In an example, the one or more of the values is sent from the test current generation circuit or from one of the measurement devices. Following the receipt of the measurement values, the BMS controller 102 may send a Start Calibration signal 302 following which one or more of the measurement devices start recording the cycles of their local clock. After a period of time, the BMS controller 102 may send a Stop Calibration signal 304, following which one or more of the measurement devices stop counting and record the total number of cycles of their local clock between the Start Calibration signal 302 and the Stop Calibration signal 304. In the example of FIG. 3, current measurement device 330 uses initial calibration counter 334 to record the total number of clock cycles 332, and voltage measurement device 320 uses initial calibration counter 324 to record the total number of clock cycles 322.

Following the counting portion of the initial calibration, the BMS controller 102 may select a timing master. The timing master may be preselected before the calibration begins, or even at the time of manufacturing. The timing master may have a more precise oscillator than one or more of the other measurement devices, such as a crystal oscillator. The timing master may share a clock with the BMS controller 102, or the timing master may be the BMS controller 102. In the example of FIG. 3, the current measurement device 330 has been selected as the timing master. Following the counting portion of the initial calibration, the current measurement device 330 may send its recorded number of clock cycles 332 to one or more of the other measurement devices, such as the voltage measurement device 320. In an example, the BMS controller 102 sends a message on the communication bus 140 to the current measurement device 330 which the current measurement device 330 modifies to include its recorded number of clock cycles 332 before sending the message to the other measurement devices. Following receipt of the recorded number of clock cycles 332 of the current measurement device 330, the other measurement devices may take an action in order to try to better synchronize their clocks with the clocks of the timing master.

The action taken by the other measurement devices may include one or more of recording the number of cycles of the timing master, adjusting the speed of their own oscillator to better match the speed of the timing master's oscillator, or calculating and recording a ratio between the speed of their local oscillator and the speed of the timing master's oscillator. Following the action taken by the other measurement devices, the initial calibration may be complete. In an example, the initial calibration may result in the measurement devices that are synchronized within one clock period of the timing master with each other. In an example, only a portion of the measurement devices may be better synchronized with the timing master following the initial calibration. In an example, each of the signals from the BMS controller 102 to the measurement devices may be a message-based signal, such as a digital packet on a serial bus. The initial calibration may be performed only once in the life of a battery monitoring system, at some regular interval such as every day, hour, or minute, once for each measurement frequency, or before every measurement.

Following the initial calibration, the BMS controller 102 may send a Measure Start signal 306 to one or more of the measurement devices following which one or more of the measurement devices begin taking a complex current or complex voltage measurement at the measurement frequency 118. In an example, the receipt of the Measure Start signal may be indicative of a timing signal to synchronize the phase measurement of the various measurement devices. Following the Measure Start signal 306, the BMS controller 102 may send a Measure Finish signal 308 to one or more of the measurement devices. At some time following the Measure Finish signal 308, the BMS controller 102 may send a Read Measurement signal 342 to read the measurement value from one or more of the measurement devices. In an example, the Measure Finish signal 308 is timed so that it is sent when the one or more measurement devices should be finishing their measurement. This timing may be performed using the estimated measurement time 352.

Figure 4:
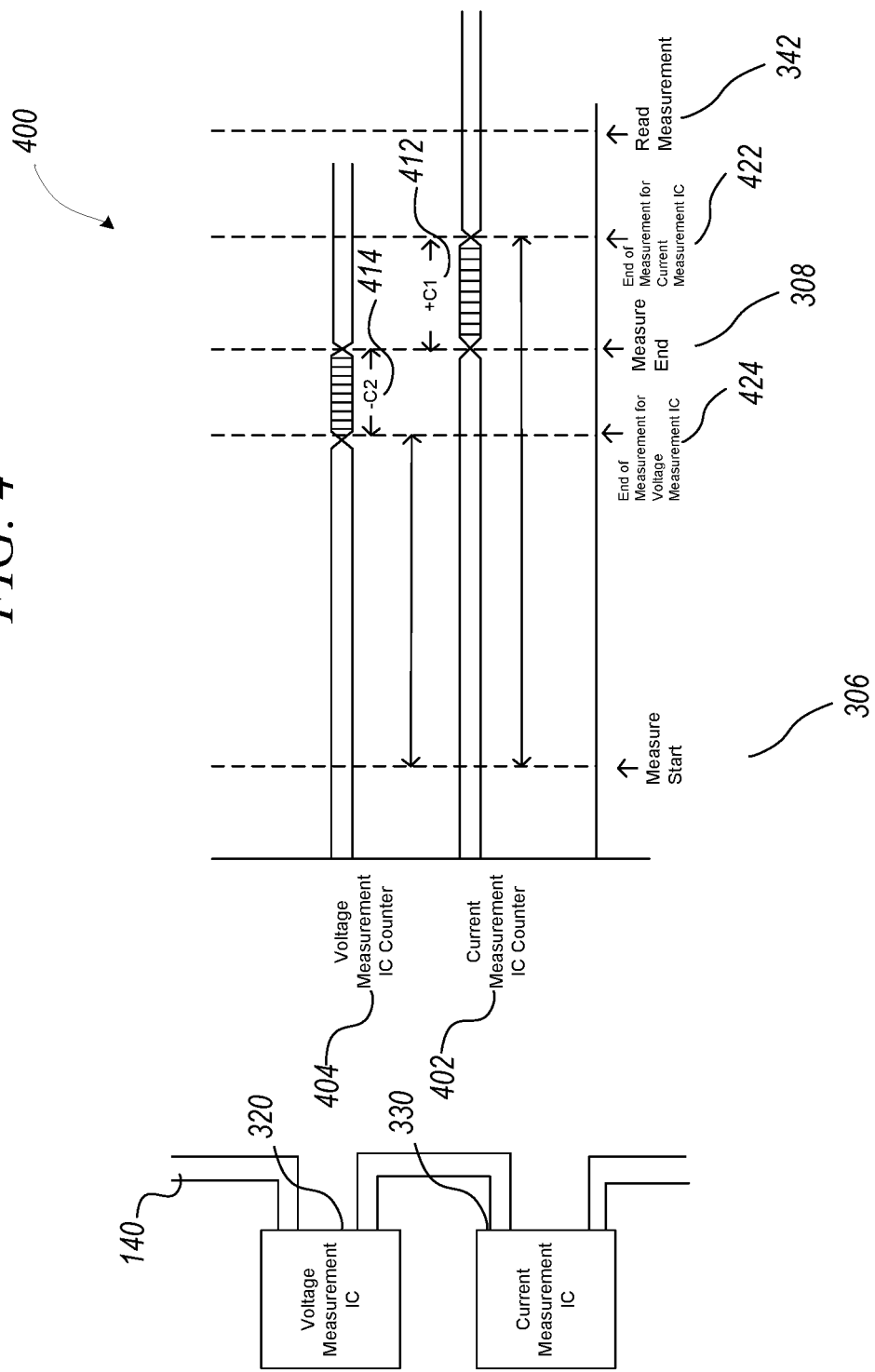
FIG. 4 is a linear graph in time showing an example of operating portions of a battery monitoring system circuit.

In addition to, or instead of, the initial calibration, the BMS controller 102 may perform an asynchrony compensation following the complex voltage and complex current measurements. FIG. 4 is a linear graph in time showing an example of operation portions of a BMS circuit 400. FIG. 4 shows a current measurement device 330, a voltage measurement device 320, a portion of the signals and messages sent and received by these measurement devices, and a portion of the internal operations of these measurement devices. In the example of FIG. 4, the various measurement devices may measure and record values that aid in performing an asynchrony compensation between particular ones of the measurement devices following their current and/or voltage measurements.

The measurement devices (330, 320) may each contain a respective asynchrony compensation counter (402, 404). The measurement devices may be configured so that following the receipt of a Measure Start signal 306, they begin taking their respective complex measurements, and continue taking their complex measurements for a length of time determined by their number of local clock cycles, the measurement length 350, and the measurement frequency 118, following which they stop measurement. In an example, the measurement devices may measure for a length of time equal to the period of their local clock multiplied by the measurement length, or the period of the measurement frequency multiplied by the measurement length. In an example, all of the measurement devices may attempt to measure for the same length of time, but differences in oscillator speeds, or ongoing error following an initial calibration, may result in the measurements running for different lengths.

The measurement devices may be configured to record the number of their local clock cycles between the end of their measurement and the receipt of a Measure Finish signal 308. If a measurement device finishes a measurement before the Measure Finish signal 308, their asynchrony compensation counter may begin counting down until the Measure Finish signal 308 is received. If a measurement device finishes a measurement after the Measure Finish signal 308, their asynchrony compensation counter may begin counting up following receipt of the Measure Finish signal 308 until the measurement is finished.

In the example of FIG. 3, the voltage measurement device 320 finishes the measurement at 424, and begins counting down with counter 404 until the Measure Finish signal 308 is received and the number of clock signals between the end of the measurement 424 and the Measure Finish signal 308 is recorded as a negative asynchrony value 414. The current measurement device 330 receives the Measure Finish signal 308 before finishing its measurement and begins counting up with counter 402 until the measurement finishes at 422, and the number of clock signals between the Measure Finish signal 308 and the end of the measurement 422 is recorded as a positive asynchrony value 412. One or more of the measurement devices may send their recorded asynchrony values to the BMS controller 102 to allow the BMS controller 102 to account for an asynchrony between one or more of the measurement devices in determining the complex impedance in one or more of the energy storage cells 106.

FIG. 5 is a flow chart 500 showing an example of a method for an initial calibration in a battery monitoring system. The method includes sending a Calibration Start signal from the controller to the voltage and current measurement devices in step 502, counting and recording, at the voltage and current measurement devices, how many cycles their local clocks go through until a Calibration Stop signal is received from the controller in step 504, selecting a timing master to transmit its count of local clock cycles to the other measurement devices in step 506, determining, at the other measurement devices, the relative speed of their local clock compared to the timing master's clock in step 508, and using the determined relative speeds to calibrate the various measurement devices in step 510.

The method shown in flow chart 500 may be performed on a battery monitoring system, such as in an electric car. The method may involve using a BMS controller to send messages to various measurement devices with the goal of helping to better synchronize the local clocks of the various measurement devices. In an example, the method shown in flow chart 500 may be performed on the battery monitoring system shown in FIG. 2.

FIG. 6 is a flow chart 600 showing an example of a method for an asynchrony compensation in a battery monitoring system. The method includes sending a Measure Start signal from the controller to the voltage and current measurement devices in step 602, sending a Measure Stop signal from the controller to the voltage and current measurement devices when the controller estimates the measurements will be ending in step 604, counting and recording, at the voltage and current measurement devices, the number of clock cycles, positive or negative, that their local clocks go through between the end of their measurement and the measure stop signal in step 606, and using the recorded number of clock cycles to compensate for an asynchrony between measurement devices in step 608.

The method shown in flow chart 600 may be performed on a battery monitoring system, such as the system shown in FIG. 2. The method may be used in some combination with the method shown in FIG. 5, such as to reduce the effect of a residual asynchrony following an initial calibration.

Portions of the circuitry or tasks performed by various integrated circuits may be combined, shared, or offloaded. In an example, the BMS controller 102 and the current measurement IC 202 may be combined. In an example, the circuitry for one or more of the voltage measurement ICs may be implemented on the BMS controller 102.

More energy storage systems and methods, including new battery chemistries, will be developed and the present techniques, systems, and methods are likely to apply, at least in part, to the new energy storage systems and methods.

What is claimed is:

1. A system for measuring a complex impedance associated with an arrangement of battery or fuel cells in an energy storage system, the system comprising:
    a controller;
    a current measurement device, shared by the cells, for measuring a test current provided to the cells; and
    voltage measurement devices, respectively coupled across corresponding cells;
    wherein the controller, the current measurement device, and the voltage measurement devices are coupled together using a DC isolated bus;
    wherein the controller determines a respective complex impedance of corresponding groups of the cells using a complex voltage measured by a respective voltage measurement device coupled across a corresponding group of the cells and a complex current measured by the current measurement device; and
    wherein the controller is configured to compensate, at the controller, for an asynchrony between particular ones of the current measurement device and the voltage measurement devices via communication over the DC isolated bus.

2. The system of claim 1 wherein the controller synchronizes the system without distributing a master clock signal to synchronize local clocks of each of the current measurement device and the voltage measurement devices.

3. The system of claim 1 wherein the voltage measurement devices are located on different integrated circuits that are DC isolated from each other along the bus.

4. The system of claim 3 wherein the different integrated circuits include respective local clocks that are asynchronous, wherein the controller is configured to compensate for the asynchrony between the particular ones of the current measurement device and the voltage measurement devices via the DC isolated bus.

5. The system of claim 4 wherein the asynchrony compensation via the DC isolated bus is provided by a message-based asynchrony compensation system.

6. The system of claim 1 wherein the complex impedance is determined from an amplitude and a phase of the measured current and voltage at a specified frequency.

7. The system of claim 1 wherein the arrangement of cells includes at least a series arrangement of cells.

8. The system of claim 7 wherein the arrangement of cells further includes a parallel arrangement of cells.

9. The system of claim 1 wherein the DC isolated bus is at least one of capacitively coupled or inductively-coupled along the bus.

10. The system of claim 1 wherein the DC isolated bus is a DC isolated serial bus with electrical isolation between a series arrangement of integrated circuits carrying corresponding ones of the current measurement device and the voltage measurement devices.

11. The system of claim 1 wherein the DC isolated bus includes
    a star arrangement of integrated circuits carrying corresponding ones of the current measurement device and the voltage measurement devices.

12. The system of claim 1 wherein the test current is provided by at least one of a traction motor load current, a regenerative braking current, a rebalancing current, or a dedicated signal generation device current.

13. The system of claim 1 wherein system is included in an automotive system and the current is provided by at least one of a traction motor load current, or a regenerative braking current.

14. A system for measuring a complex impedance of one or more battery cells in a battery system, the system comprising:
    a complex current measurement device; and complex voltage measurement devices, coupled across respective groups of the cells;

a controller, coupled to the complex current measurement device and the complex voltage measurement devices via a DC isolated bus arranged to pass complex current measurement data from the complex current measurement device and complex voltage measurement data from the complex voltage measurement devices to the controller for determining an indication of complex impedance using a complex voltage value and a complex current value.

15. The system of claim 14 wherein the controller is configured to compensate for an asynchrony between the complex current measurement device and the complex voltage measurement devices via the DC isolated bus.

16. The system of claim 15 wherein the controller compensates for asynchrony in the system without distributing a master clock signal to synchronize local clocks of each of the complex current measurement device and the complex voltage measurement devices.

17. The system of claim 14 further comprising a test signal generation device configured to generate a test current through the one or more battery cells.

18. The system of claim 17 wherein the test current is a periodic test current that has an amplitude that is periodic in time and a frequency that is adjustable.

19. A method to compensate for an asynchrony between components in a system for measuring an impedance of battery cells or fuel cells, the method comprising:

performing an asynchrony compensation between particular ones of a current measurement device and one or more voltage measurement devices associated with one or more cells in the system; and wherein the asynchrony compensation is based on measuring at least one of a time or a number of local clock cycles associated with cell current or voltage measurement by respective particular ones of the current measurement device and the voltage measurement devices relative to at least one of a Measure Start signal, which triggers respective particular ones of the current measurement device and the voltage measurement devices to begin a measurement, or a Measure Finish signal, which corresponds in time to an estimated end of the measurement of the respective particular ones of the current measurement device and the voltage measurement devices.

20. The method of claim 19 further comprising:

performing an initial calibration between particular ones of the current measurement device and the voltage measurement devices;

wherein the initial calibration is based on one or more of the current measurement device and the one or more voltage measurement devices beginning counting the number of local clock cycles following a Calibration Start signal and recording a number of cycles of their local clock following a Calibration Stop signal; and wherein a timing master is selected to send the recorded number of cycles of the timing master to one or more of the current measurement device and one or more voltage measurement devices.

* * * * *